US008826086B2

(12) United States Patent
Hook et al.

(10) Patent No.: US 8,826,086 B2
(45) Date of Patent: Sep. 2, 2014

(54) MEMORY CARD TEST INTERFACE

(75) Inventors: Charles Moana Hook, Patterson, CA (US); Loc Tu, San Jose, CA (US); Nyi Nyi Thein, Lathrop, CA (US); James Floyd Cardosa, San Jose, CA (US); Ian Arthur Myers, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 743 days.

(21) Appl. No.: 13/022,404

(22) Filed: Feb. 7, 2011

(65) Prior Publication Data

US 2012/0201091 A1 Aug. 9, 2012

(51) Int. Cl.
*G11C 29/00* (2006.01)
*G01R 31/00* (2006.01)
*G11C 29/48* (2006.01)
*G11C 29/56* (2006.01)

(52) U.S. Cl.
CPC ........ *G11C 29/48* (2013.01); *G11C 2029/5602* (2013.01)
USPC .......................................... 714/718; 714/734

(58) Field of Classification Search
USPC .......................................... 714/718, 724, 734
See application file for complete search history.

(56) References Cited

U.S. PATENT DOCUMENTS

| | | | |
|---|---|---|---|
| 7,007,215 B2* | 2/2006 | Kinoshita et al. | 714/745 |
| 7,184,916 B2* | 2/2007 | Resnick et al. | 702/118 |
| 7,359,204 B1 | 4/2008 | Jang et al. | |
| 7,814,377 B2* | 10/2010 | Stolero et al. | 714/718 |
| 8,132,062 B2* | 3/2012 | Stolero et al. | 714/718 |
| 8,140,900 B2* | 3/2012 | Yang et al. | 714/27 |
| 8,347,176 B2* | 1/2013 | Resnick et al. | 714/758 |
| 2003/0009715 A1* | 1/2003 | Ricchetti et al. | 714/727 |
| 2007/0099312 A1 | 5/2007 | Pourkeramati et al. | |
| 2007/0125869 A1 | 6/2007 | Chuang | |

OTHER PUBLICATIONS

Resnick, D., "Embedded test for a new memory-card architecture," Test Conference, 2004. Proceedings. ITC 2004. International, vol., No., pp. 875,882, Oct. 26-28, 2004.*

Chanik Park; Seungmo Cho; Lee, Jaewook; Hyungjun Park, "Co-validation environment for memory card compatibility test: a case study," Rapid System Prototyping, 2004. Proceedings. 15th IEEE International Workshop on, vol., No., pp.62,65, Jun. 28-30, 2004.*

* cited by examiner

*Primary Examiner* — Cynthia Britt
(74) *Attorney, Agent, or Firm* — Vierra Magen Marcus LLP

(57) ABSTRACT

A memory card and methods for testing memory cards are disclosed herein. The memory card has a test interface that allows testing large numbers of memory cards together. Each memory card may have a serial data I/O contact and a test select contact. The memory cards may only send data via the serial data I/O contact when selected, which may allow many memory cards to be connected to the same serial data line during test. Moreover, existing test socket boards may be used without adding additional external circuitry. Thus, cost effective testing of memory cards is provided. In some embodiments, the test interface allows for a serial built in self test (BIST).

19 Claims, 11 Drawing Sheets

*Fig. 13*
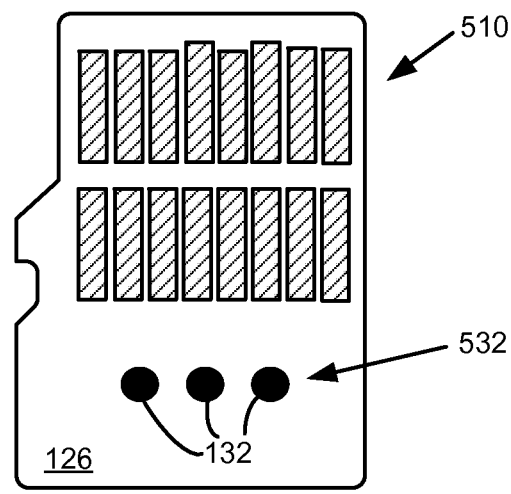
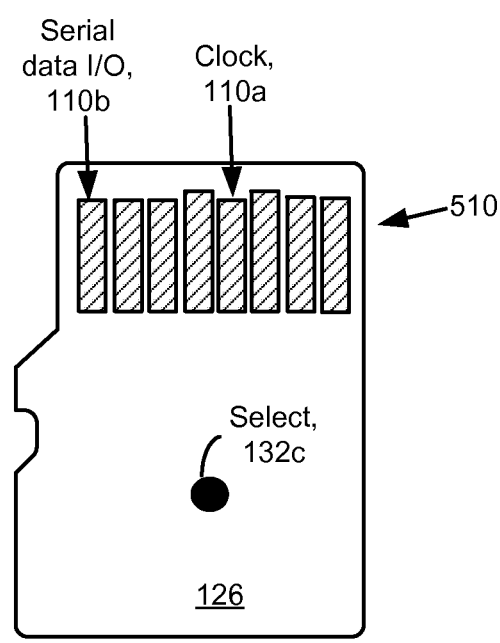
*Fig. 14*

MEMORY CARD TEST INTERFACE

BACKGROUND

1. Field

Embodiments relate to memory cards having non-volatile storage.

2. Description of the Related Art

Numerous types of portable memory cards are known. Example memory card formats include, but are not limited to, Secure Digital (SD), CompactFlash®, Memory Stick, and SmartMedia. Some memory cards may comply with a form factor provided in an industry or other specification. Often these memory cards are quite small such that they can be inserted into various electronic devices, or for other reasons. Moreover, for some memory cards, industry specification may dictate that the memory card has an interface having pins each with a specified function. In some cases, the pins may occupy a significant portion of the surface of the memory card.

After manufacturing a memory card, typically a series of tests are conducted to determine whether the memory card is functioning properly. For example, these tests may write to and read from the memory to test the memory. One testing technique is to connect a memory card to external testing circuitry, which instructs the memory card to run the tests.

Thus, the memory card needs some sort of interface that allows connection to the external testing circuitry. Moreover, the interface should allow the memory card to enter a test mode. However, there may be a very limited amount of surface area on the memory card to use for the test interface. Note that regardless of whether a memory card complies with industry specification, the foregoing problems may exist.

BRIEF DESCRIPTION OF THE DRAWINGS

FIG. 13 is a diagram of one embodiment of a memory card in which there are two rows of host interface pins.

FIG. 14 is a diagram of one embodiment of a memory card in which the test interface has a single contact.

DETAILED DESCRIPTION

Embodiments will now be described. It is understood that the present disclosure may be embodied in many different forms and should not be construed to being limited to the embodiments set forth herein. Rather, these embodiments are provided so that this disclosure will be thorough and complete and will fully convey embodiments to those skilled in the art. Indeed, the disclosure is intended to cover alternatives, modifications and equivalents of these embodiments. Furthermore, in the following detailed description of embodiments, numerous specific details are set forth. However, it will be clear to those with ordinary skill in the art that such specific details may not be required in all embodiments.

A memory card and methods for forming and testing memory cards are disclosed herein. In one embodiment, the memory card has a test interface that allows testing large numbers of memory cards together. Each memory card may have a serial data I/O contact and a test select contact. The memory cards may only send data via the serial data I/O contact when selected, which may allow many memory cards to be connected to the same serial data line during test. Moreover, existing test socket boards may be used without adding additional external circuitry. Thus, cost effective testing of memory cards is provided. In some embodiments, the test interface allows for a serial built in self test (BIST).

Figure 1:
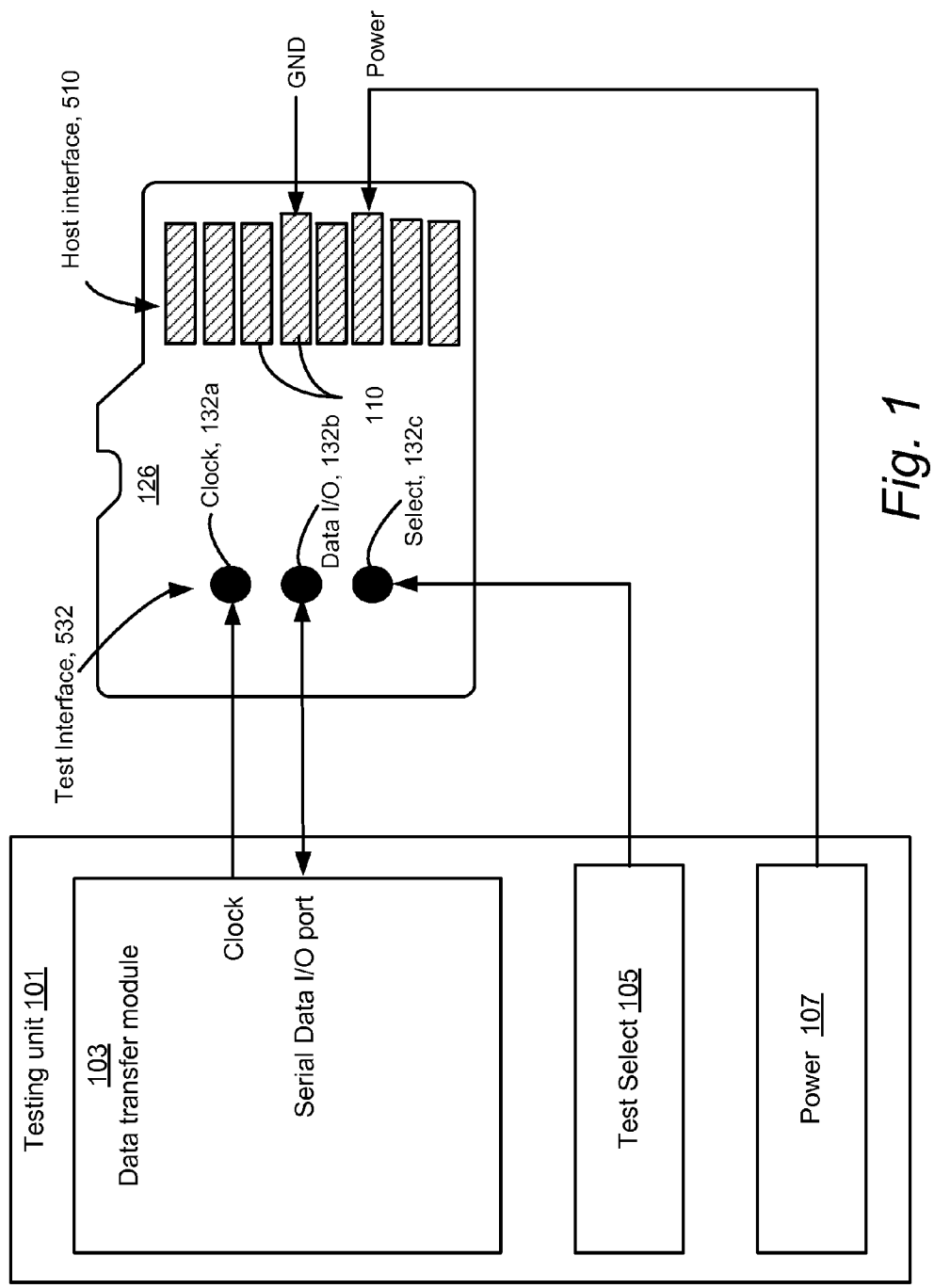
FIG. 1 is a diagram of one embodiment of a memory card and testing unit.

FIG. 1 is a diagram of one embodiment of a memory card 126 and testing unit 101. The memory card 126 has three contacts 132 that are part of a test interface 532. Specifically, the test interface 532 has a clock contact 132a, a serial data I/O contact 132b, and a select contact 132c. The data I/O contact 132b may be used for serial transfer of data to/from the memory card 126 during a test mode. The clock contact 132a may be used for timing the serial data transfer. The select contact 132c may be used as test select. In one embodiment, when a memory card 126 is selected by a test select signal at the select contact 132c, the memory card 126 may go into a mode in which serial test data is transferred via the data I/O contact 132b. However, if the memory card 126 is not selected with the select signal at the select contact 132c, then the memory card 126 will not send data via the data I/O contact 132b. In some embodiments, once in the test mode, the memory card 126 stays in the test mode regardless of the state of the signal applied to the select contact 132c. The functionality of the contacts 132 will be discussed further below.

The memory card 126 has a host interface 510 that includes pins 110. In normal use, the memory card 126 may be inserted into a host device with various pins 110 of the host interface 510 having defined functionality. For example, the pins 110 may have functions such as ground, power, clock, one or more data lines, command, etc. In some embodiments, the memory card 126 may be put into different modes, with the pins 110 having different functions in each mode. The memory card 126 of FIG. 1 is depicted with eight pins 110. In some embodiments, there are nine pins 110. In some embodiments, there are eleven pins 110. The memory card 126 could have other numbers of pins 110. In some embodiments, there are two or more rows of pins 110 in the host interface 510. Having two rows of pins 110 may allow for significantly more pins 110.

The testing unit 101 has a data transfer module 103 having a serial data I/O port to communicate test data serially to and from the memory card 126. In this embodiment, the testing unit 101 provides a clock signal to the memory card 126. The testing unit 101 also has test select logic 105 that provides a select signal to the select contact 132c of the memory card 126. As noted, the select signal may be used to instruct the memory card 126 that serial data should be received or sent using data I/O contact 132b. For example, if the memory card 126 is not selected, then the memory card 126 may ignore any data that is provided to it at the data I/O contact 132b. Also, if the memory card 126 is not selected, then the memory card 126 should not send any data via data I/O contact 132b.

In this embodiment, the testing unit 101 provides power to a power pin 110 of the memory card 132 via power module 107. However, power could be provided by another device. One of the pins 110 of the memory card 126 is grounded in this embodiment. Note that for other embodiments, power and ground may be provided to other pins 110 in the host interface 510. Also, it is not an absolute requirement that power and ground be provided through the host interface 510. Some memory cards 126 may have other inputs for receiving power and ground.

Figure 2:
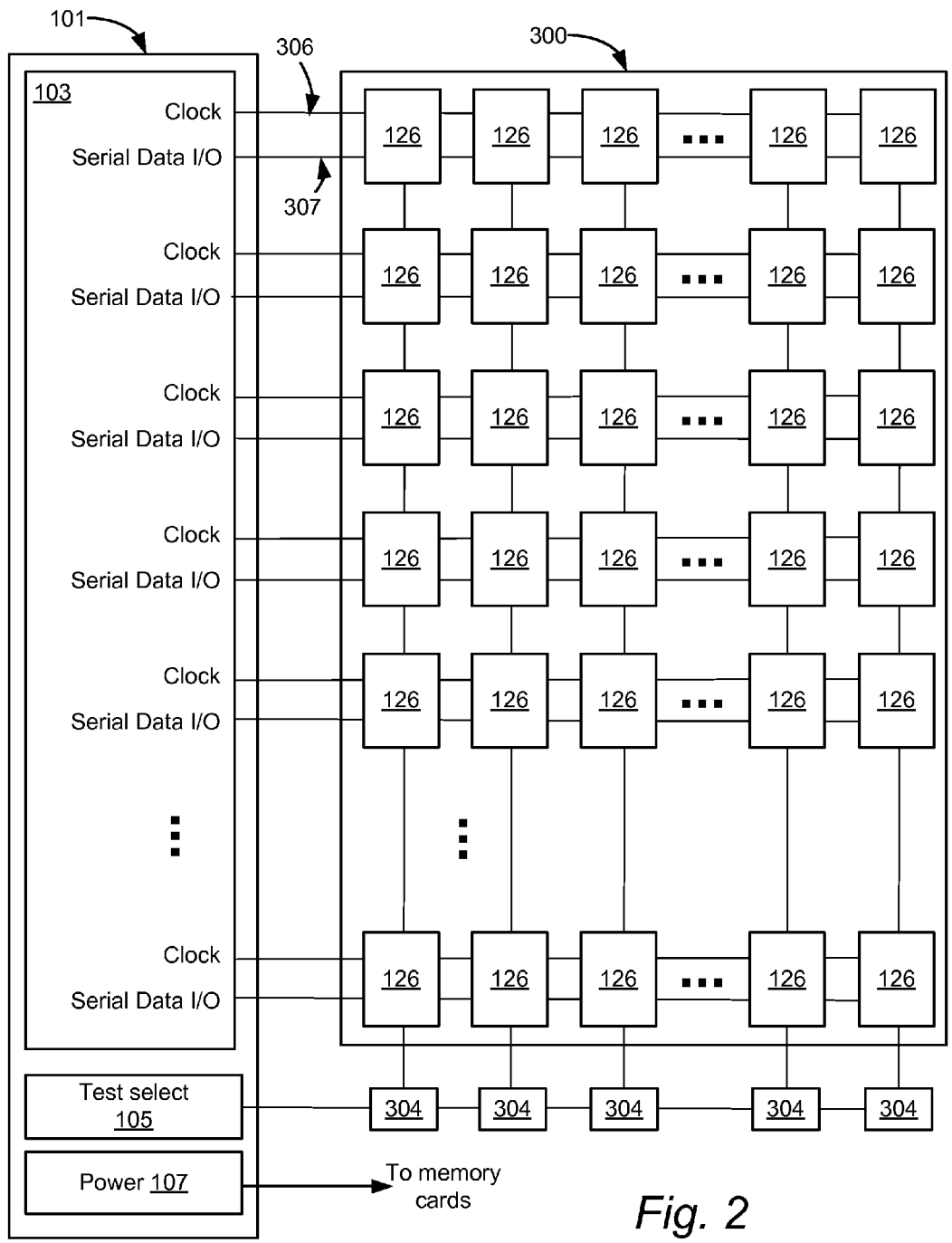
FIG. 2 shows a system of one embodiment of ganged testing of memory cards.

Note that the testing unit 101 of FIG. 1 is a simplified version of one that may be used in actual practice. In actual practice, many memory cards 126 may be connected to the testing unit 101 for what is sometimes referred to as "ganged" testing. FIG. 2 shows a system of one embodiment of ganged testing of memory cards 126. The system has a testing unit 101 that is connected to an apparatus 300 for holding devices under test (DUTs). In this case, the DUTs are memory cards 126. The apparatus 300 may have sockets (not depicted in FIG. 2) for holding an array of memory cards 126.

The testing unit 101 is similar to the one depicted in FIG. 1, but its data transfer module 103 has many serial data I/O ports. The test select logic 105 provides test select signals to registers 304, one of which is connect to each column (or bank) of memory cards 126. Specifically, a given register 304 is connected to the select contact 132c of every memory card 126 in that column. Note that the contacts 132 are not depicted in FIG. 2, thus the actual connection to the select contact 132c is not depicted in FIG. 2. Every memory card 126 in a given column may be selected or unselected in unison. Therefore, one or more columns of memory cards 126 may be selected at a time. At some times, every column might be selected. At other times, only one column is selected. In some cases more than one, but less than all columns of memory cards 126 may be selected. In one embodiment, a test select signal is propagated (or scanned) from one register 304 to the next such that each successive column of memory cards 126 is selected.

For the purpose of illustration, the data transfer module 103 has one clock output depicted for each serial data I/O port. Thus, one clock line 306 is provided to each row of memory cards 126. However, memory cards 126 in the same row could receive different clock lines 306. For example, there might be a global clock source that provides the clock signal for each memory card 126 and for the testing unit 101. The clock may be provided to the clock contact 132a (not depicted in FIG. 2).

Each serial data I/O line 307 connects to each memory card 126 in a given row in this embodiment. Specifically, a given data serial data I/O line 307 may be connected to the data I/O contact 132b of each memory card 126 in that row (contact 132b not depicted in FIG. 2). As noted, the memory cards 126 may receive serial data at the data I/O contact 132b. If all memory cards 126 in a given row are presently selected, each memory card 126 will receive and process data from the serial data I/O line 307. On the other hand, if only one memory card 126 in that row is selected, then it will be the only memory card 126 to receive and process data from the serial data I/O line 307.

Typically, only one memory card 126 in a row is selected when the serial data I/O line 307 is being used to transfer data from the selected memory card 126 to the test unit 101. As noted previously, a test select signal can be scanned through the registers 304 to select one column of memory cards 126 at a time.

Note that during the same general testing of all of the memory cards 126, test data might be sent to all memory cards 126, then each column of memory cards 126 might be selected one at a time to send back test results. Thus, by appropriate selection of the memory cards 126, many memory cards 126 can be placed in the apparatus 300 and tested during the same general test process. Further examples will be provided below of efficiently testing many memory cards 126 in a ganged fashion. Also note that, in some embodiments, no special external circuitry is required to be connected to the test interface 532.

Note that there may be any number of rows of memory cards 126 and any number of columns of memory cards 126. The testing unit 101 may also provide power to the memory cards 126, similar to the example of FIG. 1. Each of the memory cards 126 may also be connected to a common ground (not depicted in FIG. 2). This may be achieved through one of the pins 110 in a similar manner as the example of FIG. 1, although the ground could be provided in a different manner.

Figure 3A:
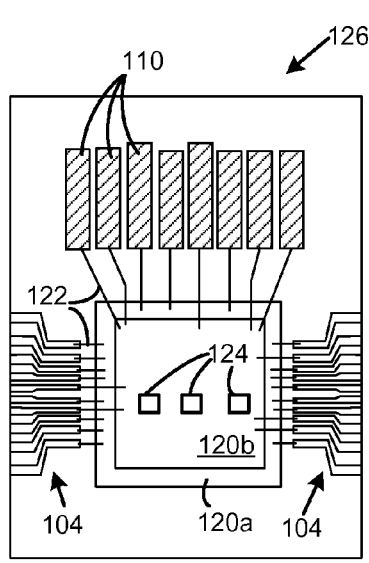
FIG. 3A depicts one embodiment of a memory card to show details of semiconductor dice and leadlines.

FIG. 3A depicts one embodiment of a memory card 126 to show details of semiconductor dice and leadlines. Two semiconductor dice 120a, 120b may be seen, although there may be more. The semiconductor dice 120 may include flash memory chips (NOR/NAND) and/or a controller chip such as an ASIC, as examples. Leadlines 122 connect the semiconductor dice 120 to a printed circuit board (not depicted), the pins 110, or elsewhere. Three bond pads 124 are depicted in semiconductor die 120b for accessing circuitry within the die. Note that there may be other pads, which are not depicted. For example, additional bond pads may be attached to leadlines 122 by, for example, a known wire bond process.

In some embodiments, some of the bond pads 124 may serve as test pads, which may be used for wafer level testing. For example, a wafer having many semiconductor dice can be placed into a tester to test each die using the test pads. Some die may have as few as three test pads. For example, one test pad may be for power, another for ground and the third for test data. However, a die may have a greater number of test pads.

Figure 3B:
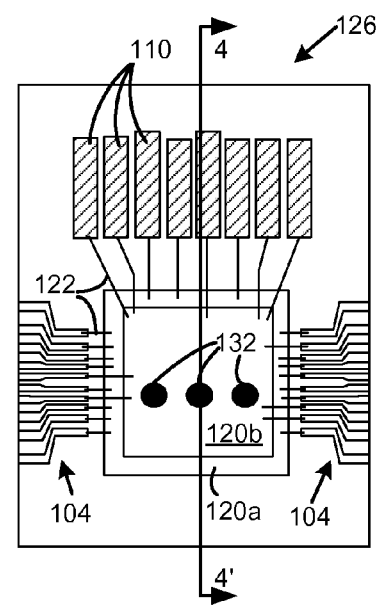
FIG. 3B depicts a top view of one embodiment of a memory card to show how contacts may be attached to bond pads.
Figure 4:
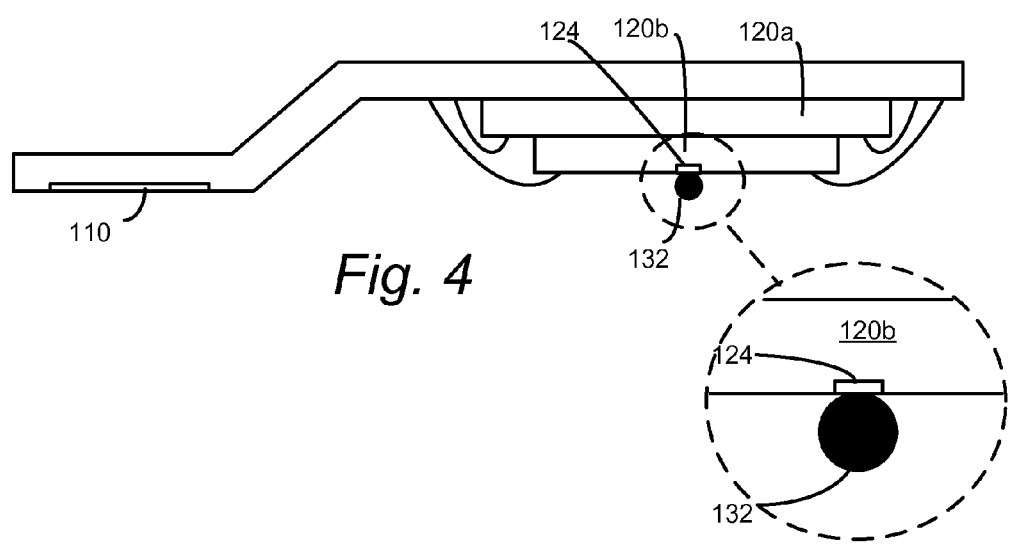
FIG. 4 is a side view of the embodiment shown in FIG. 3B.

In some embodiments, these same test pads that are used for wafer level testing may be used for testing the memory card 126. FIGS. 3B and 4 depict one embodiment of a memory card 126 to show how contacts 132 may be attached to bond pads 124. FIG. 3B depicts details of the inside of a memory card 126 from a top view. FIG. 4 shows a side view along the line 4-4' of FIG. 3B, such that one contact 132 may be seen. Referring now to FIG. 3B, three contacts 132 are depicted over the location where the pads 124 are in FIG. 3B.

In one embodiment, the contacts 132 are formed from a mass of solder (solder bumps) FIG. 4 shows one such "solder bump" contact 132 attached to bond pad 124 on semiconductor die 120b. Thus, the solder bump may be physically integrated to the bond pad 124. Solder bumps may be of known solder material, such as lead/Tin (Pb/Sn) or the like. Other possibilities include nickel/Au bumps, epoxy bumps and gold bumps. It is also possible to use solder bumps with polymer cores. It is understood that other electrically conductive, deformable materials may be used in place of solder in alternative embodiments.

The contacts 132 may be attached to bond pads 124 using known solder bumping processes, such as for example those used for attaching solder bumps in flip chips and ball grid arrays (BGAs). In such processes, the bond pads 124 may first be preconditioned in an under bump metallurgy (UBM) step to eliminate non-conductive aluminum oxide as is known in the art. The UBM step provides a low and stable contact resistance at the bump-bond pad interface, but the UBM step may be omitted in alternative embodiments. The solder bumps may then be attached to the bond pads 124 in many processes, including evaporation, electroplating, printing, jetting, stud bumping, and direct placement, each of which is known in the art. In a further embodiment, the solder bumps could be preformed solder balls affixed to bond pads 124 using force and/or heat as is known in the art.

Once the memory card 126 is fabricated and tested, the memory card 126 may be encased in a pair of mating lids which cover the contacts 132, and prevent their access while the memory card 126 is in use. The memory card 126 may operate without lids in further embodiments. In such embodiments, the contacts 132 may be covered using for example a masking label, epoxy or ink. It is also conceivable that the contacts 132 be left uncovered. Moreover, while the solder bumps 132 are disclosed above as being mounted directly onto bond pads 124 on the controller chip 120b, it is understood that the solder bumps 132 forming the contacts 132 may be provided on the memory chip 120a, or elsewhere, and connected to the appropriate bond pad 124 with the use of conductive traces and/or bond wires.

Figure 5:
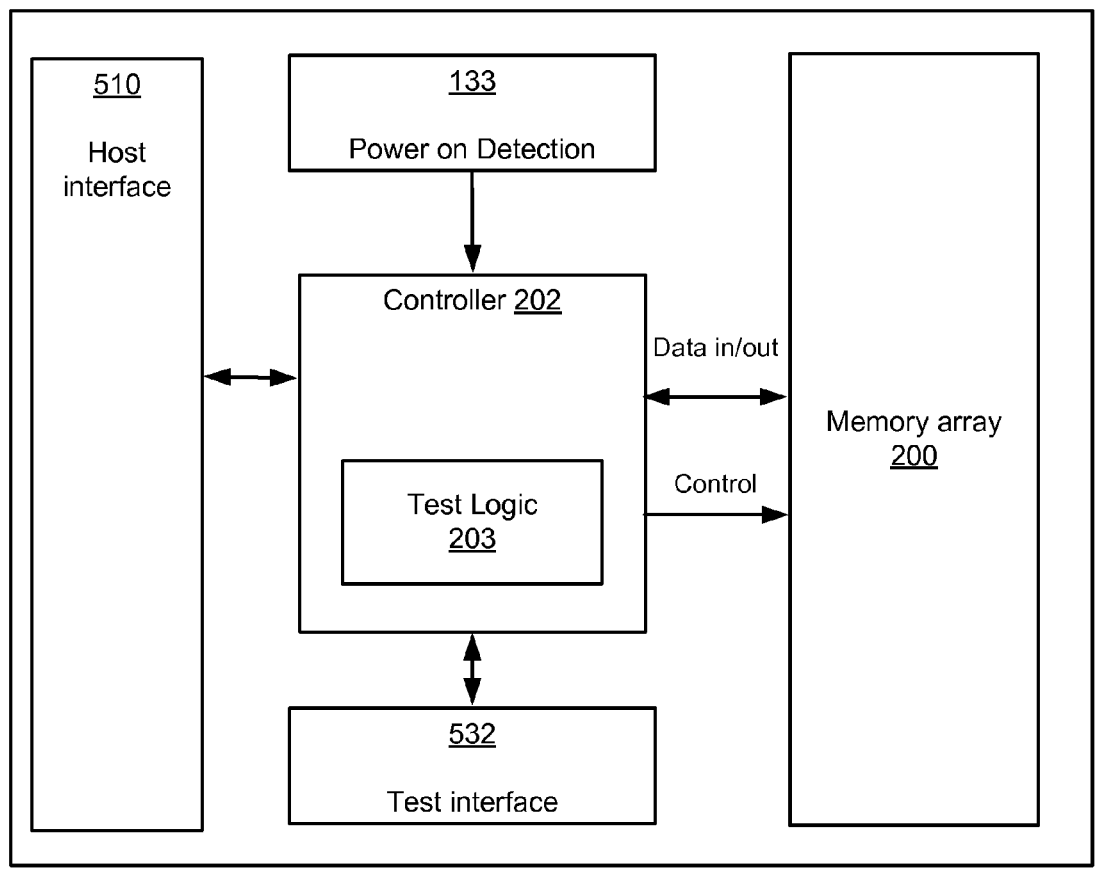
FIG. 5 is a block diagram showing further details of one embodiment of a memory card.

FIG. 5 is a block diagram showing further details of one embodiment of a memory card 126. The memory card 126 has a host interface 510, test interface 532, controller 202, and memory array 200. Example host interfaces 510 have previously been described. As noted, the host interface 510 could have any number of pins 110. The test interface 532 may have one or more contacts 132.

The controller 202 interfaces with the host interface 510 such that a host device (not depicted) may send commands, as well as data to be stored in the memory array 200. Likewise, the host may access data from memory array 200. Controller 202 sends control signals to the memory array 200 and controls data transfers to/from memory array 200. In one embodiment, the memory array 200 is a NAND array.

The controller 202 has test logic 203 coupled the test interface 532. When the memory card 126 is in a test mode, the test logic 203 responds to commands and data received through the test interface 532 to test the memory array 200. For example, the memory array 200 could be erased, written and read in a test mode. The test logic 203 may also send data and test results out through the test interface 532. In some embodiments, a single data I/O contact 132b is used for communicating data during the test mode. Note that testing the memory card 126 through test interface 532 is not limited to testing the memory array 200.

Also depicted in FIG. 5 is power on detection 133, which sends a signal to the controller 202 upon detecting power on. The controller 202 may reset in response to this signal. In some embodiments, the memory card 126 enters a test mode upon power on, assuming appropriate signals are provided to the test interface 532.

Figure 6:
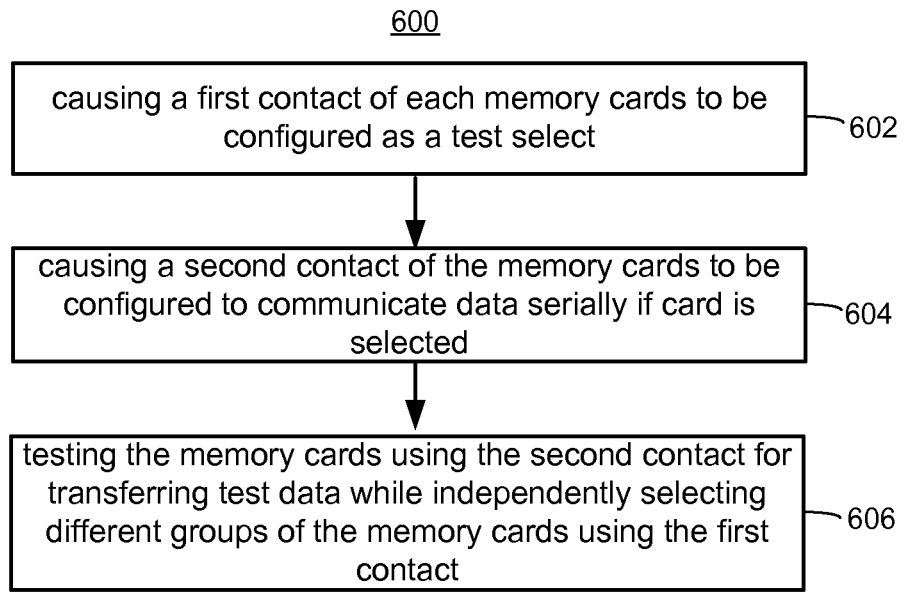
FIG. 6 is a flowchart of one embodiment of a process of testing memory cards.

FIG. 6 is a flowchart of one embodiment of a process 600 of testing memory cards 126. The process 600 may be performed in a system such as the example depicted in FIG. 2. In step 602, the test unit 101 causes the select contact 132c (e.g., a first contact) of each of the memory cards 126 to be configured as a test select. Further details are discussed below. However, briefly this may be achieved by powering on memory cards 126 and sending appropriate data to one or more of the contacts 132. By configuring a contact it will be understood that certain logic, such as test logic 203, may change its state such that the contact 132c is used in a certain way.

Thus, the memory card 126 may undergo a change of state in response to having its select contact 132c configured. When its select contact 132c is configured as a test select, a given memory card 126 monitors its select contact 132c for a test select signal, which may have a select state and an unselect state. For example, test logic 203 monitors the select contact 132c. In other words, the memory card 126 enters a mode in which the test select contact 132c is enabled as a test select. In some embodiments, the select contact 132c has multiple functions, such that the memory card 126 might interpret signals at the select contact 132c as other than a test select signal when contact 132c is serving another function.

In step 604, the testing unit 101 causes the data I/O contact 132b (e.g., second contact) of respective memory cards 126 to be configured to communicate data serially while the test select signal at the select contact 132c of the respective memory cards 126 has the select state. The memory cards 126 do not transmit any data on the data I/O contact 132b when the test select signal provided to the select contact 132c has the unselect state. Step 604 may be accomplished by sending appropriate data to one or more of the contacts 132. Note that steps 602 and 604 could be performed in a different order. In some embodiments, step 604 follows step 602. In other embodiments, step 604 precedes step 602.

Step 606 is testing the memory cards 126 using the serial data I/O contact 132b for transferring test data while independently selecting different groups of the memory cards 126 using the select contact 132c. For example, test data is transferred to or from selected columns of memory cards 126. Note that in some cases, test data might be transferred to all columns of memory cards 126. As noted, in the embodiment of FIG. 2, test data is received from only one column of memory cards 126 at a time.

Figure 7:
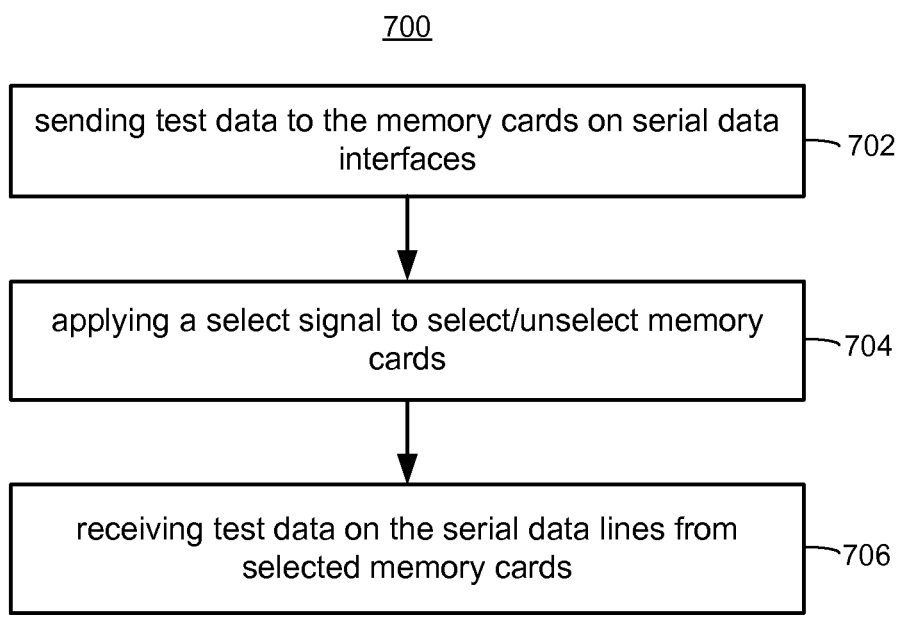
FIG. 7 is a flowchart of one embodiment of a process of testing memory cards.

FIG. 7 is a flowchart of one embodiment of a process 700 of testing memory cards 126. Process 700 is one embodiment of step 606 of process 600. Thus, prior to process 700, the test interface 532 has been configured. Process 700 may be performed by a test unit, such as the test unit 101 of FIG. 2. In step 702, the test unit 101 sends test data and/or commands to at least some of the memory cards 126 on serial data lines 307. During step 702 any number of columns of memory cards 126 may be selected. As one example, all of the columns are selected. In the embodiment of FIG. 2, a given data line 307 provides test data to one memory card 126 in each column. Note that a different arraignment could be used.

In step 704, the testing unit 101 applies a select signal to select/unselect memory cards 126. The select signal may have a select state and an unselect state, such that the select state is used to select memory cards 126 in a column (e.g., group) while the unselect state is used for any unselected columns of the memory cards 126. Referring to the example of FIG. 2, the test select logic 105 provides the select signal to the registers 304. The select signal could simply be a binary signal with a "1" being select and a "0" being unselect (or the reverse). The state of the register 304 determines whether a column of memory cards 126 is selected or unselected. One or more of the columns of memory cards 126 is selected for test at a time. As noted, when a memory card 126 is selected for test, it responds to and sends data via the serial data I/O contact 132b. As previously noted, a memory card 126 may stay in a test mode regardless of whether it is presently selected for test. Note that selecting a column is one example of selecting a group of memory cards 126, but the group could be some other configuration of memory cards 126.

In step 706, the testing unit 101 receives test data on the serial data lines 307 from the selected memory cards 126. For example, data is received while the select signal with the select state is applied to selected memory cards 126 and the select signal with the unselect state is applied to unselected memory cards 126. Each of the serial data lines 307 receives test data from one memory card 126 in the selected column (e.g., group). For example, when memory cards 126 send data to the test unit 101 only one column of memory cards 126 is selected in the embodiment of FIG. 2.

Figure 8:
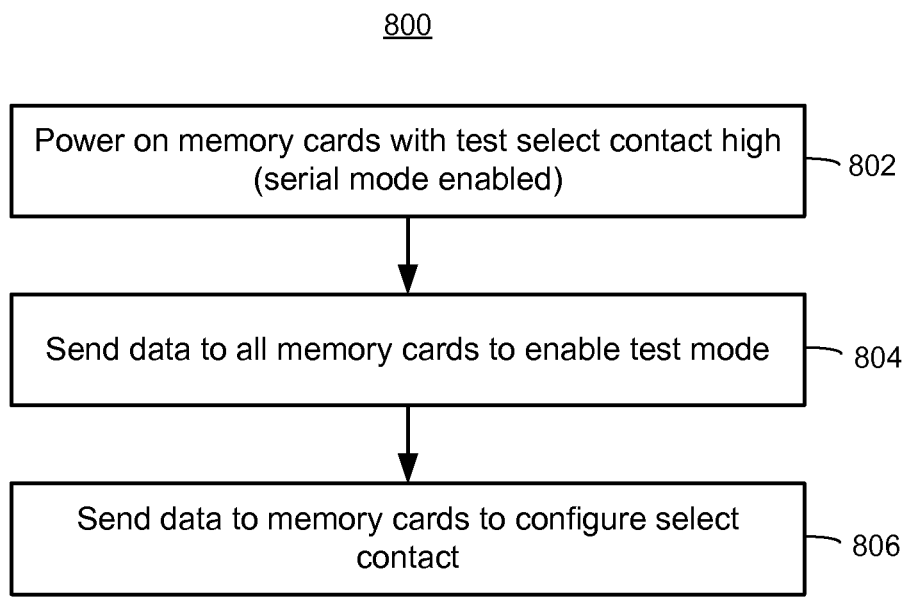
FIG. 8 is a flowchart of one embodiment of a process of initially configuring the contacts of memory cards for test functionality.

FIG. 8 is a flowchart of one embodiment of a process 800 of initially configuring the contacts 132 of memory cards 126 for test functionality. Process 800 is one embodiment of steps 602 and 604 of process 600. Process 800 may be performed in a system such as the example of FIG. 2. The steps of process 800 may be performed by the testing unit 101. It will be understood that the memory cards 126 will undergo changes of state in response to various data sent to them. As noted, a phrase such as "configuring a contact" will be understood to mean that logic (such as test logic 203) associated with the contacts 132 is altered such that the memory card 126 uses the contact 132 in a certain manner.

In step 802, the memory cards 126 are powered on with the test select contact 132c high. This may enable a serial mode for the test interface 132. By a serial mode it is meant that the controller 202 (e.g., test logic 203) will respond to data and commands received at data I/O contact 132b, using serial communication. In some embodiments, the testing unit 101 provides power to the memory cards 126 through one of the pins 110 in the host interface. The test select logic 105 may provide the proper signal to each of the memory cards 126 to cause the test select contact 132c to be high. In some embodiments, the memory cards 126 are powered on slightly after providing the high signal to the test select contacts 132c. In some embodiments, power on detection 133 in the memory card 126 detects the power on and sends a reset signal to the controller 202. The test logic 203 responds entering a state in which it monitors test select contact 132c for the test select signal.

In step 804, the testing unit 101 sends data to all memory cards 126 to enable a test mode. The test mode may allow the memory array 200 to be tested by the use of data and commands sent through the test interface 532. There are many possible ways to cause the memory card 126 to enter the test mode. As one example, a series of commands are sent to the memory card 126 using the serial data I/O contact 132b. Note that it is not required that the serial data I/O contact 132b be used to cause the memory card 126 to enter the test mode. That is to say, for some memory cards 126 the test mode might be entered by sending commands through the host interface 110 or another contact of the test interface 532.

In step 806, data and/or commands are sent to the memory cards 126 to cause the test select contact 132c to be configured as a test select. In some embodiments, step 806 includes sending suitable data and/commands to the memory cards 126 through their serial data I/O contacts 132b. Note that it is not required that the serial data I/O contact 132b be used to configure the test select contact 132c. Also note that the memory cards 126 may remain in the test mode even if the test select signal applied to the test select contact 132c is toggled. However, now that the test select contact 132c has been configured, the memory cards 126 may treat the serial data I/O contact 132b differently. For example, if a memory card 126 is not presently selected, it may ignore any data received on the serial data I/O contact 132b. This may allow the test unit 102 to, for example, request test results from one memory card 126 in a row.

Next several possible testing scenarios will be discussed. Reference will be made to the example test system of FIG. 2 when discussing the test scenarios. These testing scenarios are examples of step 606 of process 600 of FIG. 6. Thus, the memory cards' test interfaces 532 have already been configured prior to the beginning of these test scenarios. Thus, the memory cards 126 are already in a test mode. Moreover, each memory card 126 is monitoring the test select contact 132c to determine whether it has been selected for communicating data on the serial data I/O line 307.

Figure 9:
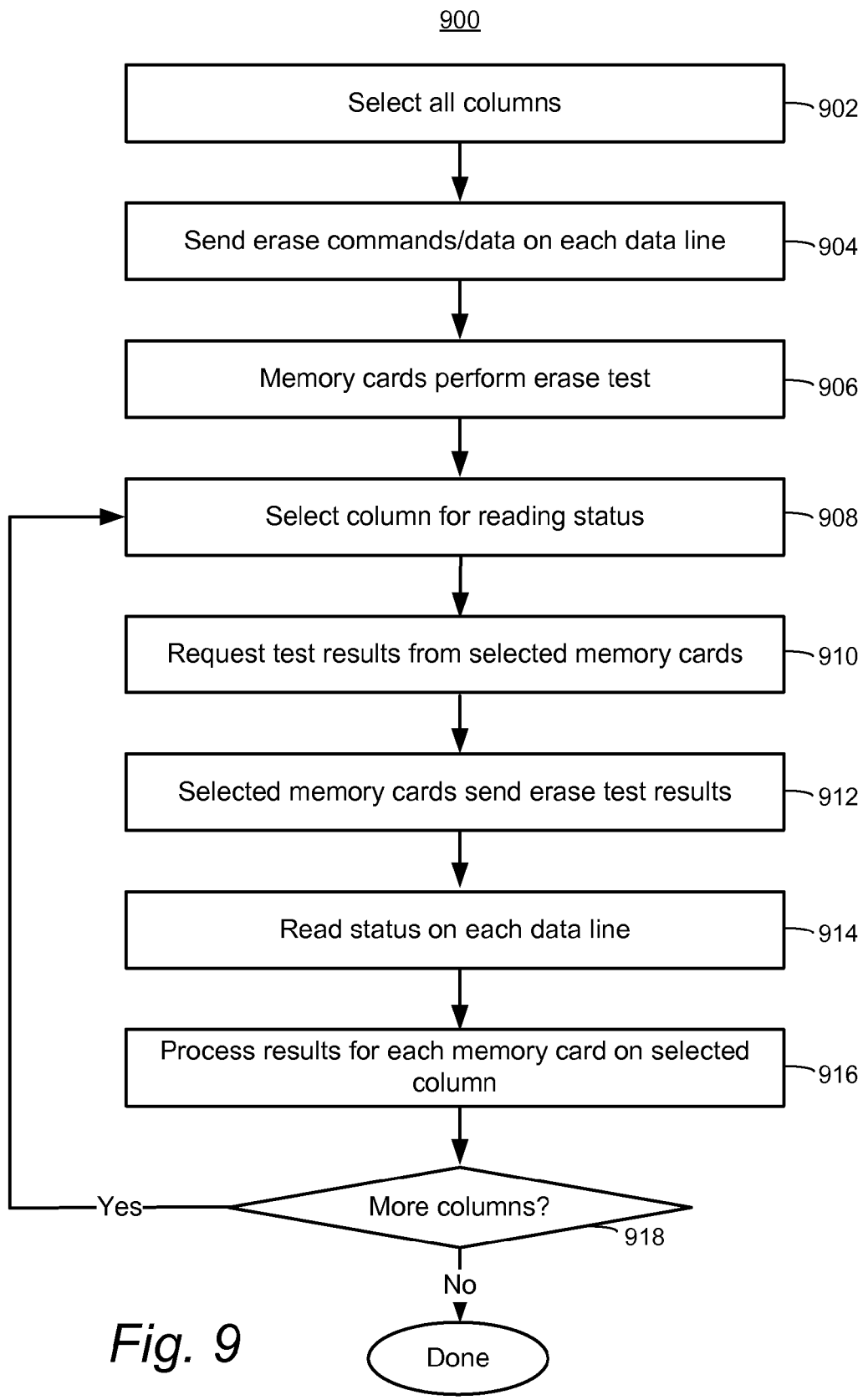
FIG. 9 is a flowchart of one embodiment of a process of testing erase of the memory array.
Figure 10:
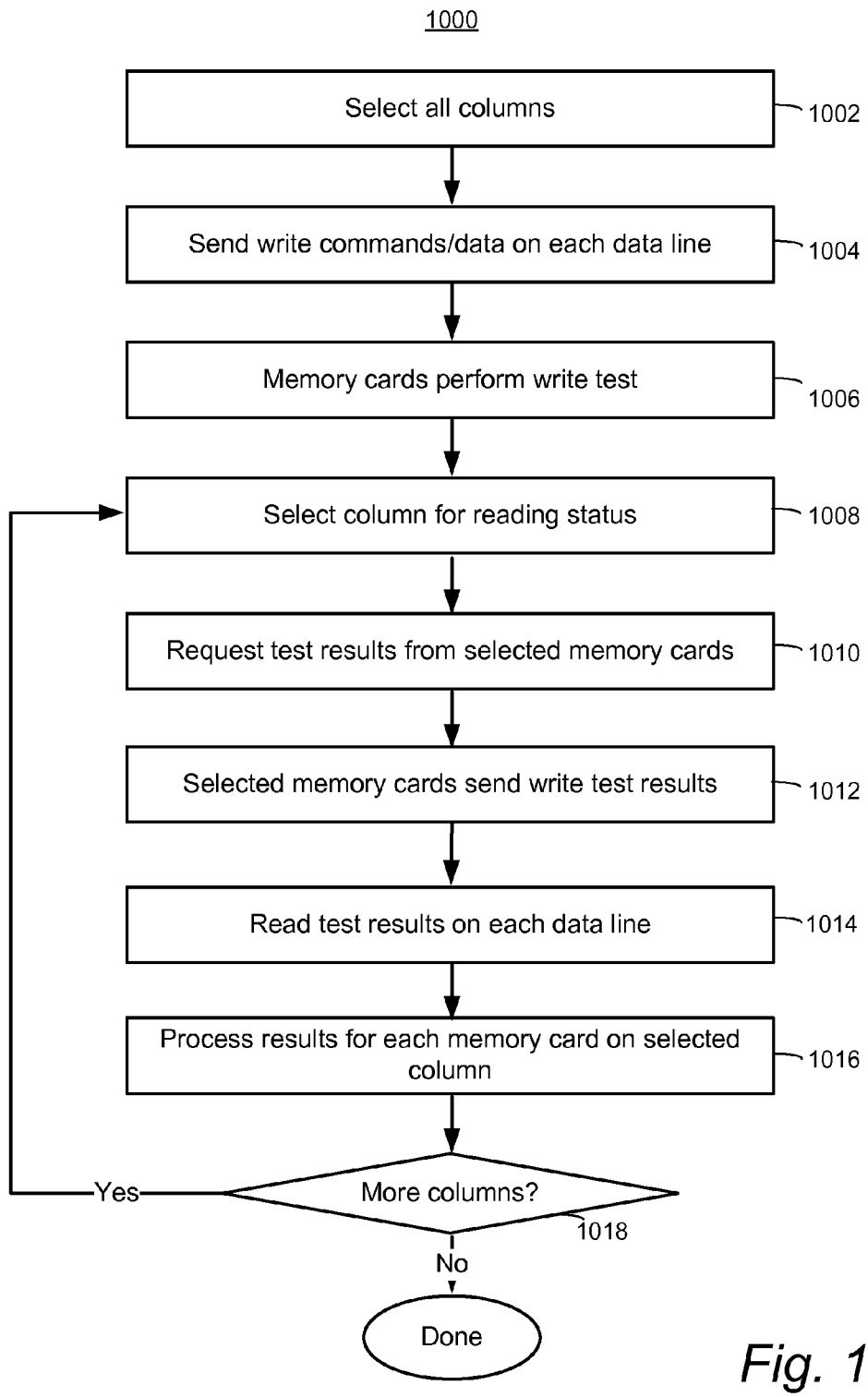
FIG. 10 is a flowchart of one embodiment of a process of testing write of the memory array.
Figure 11:
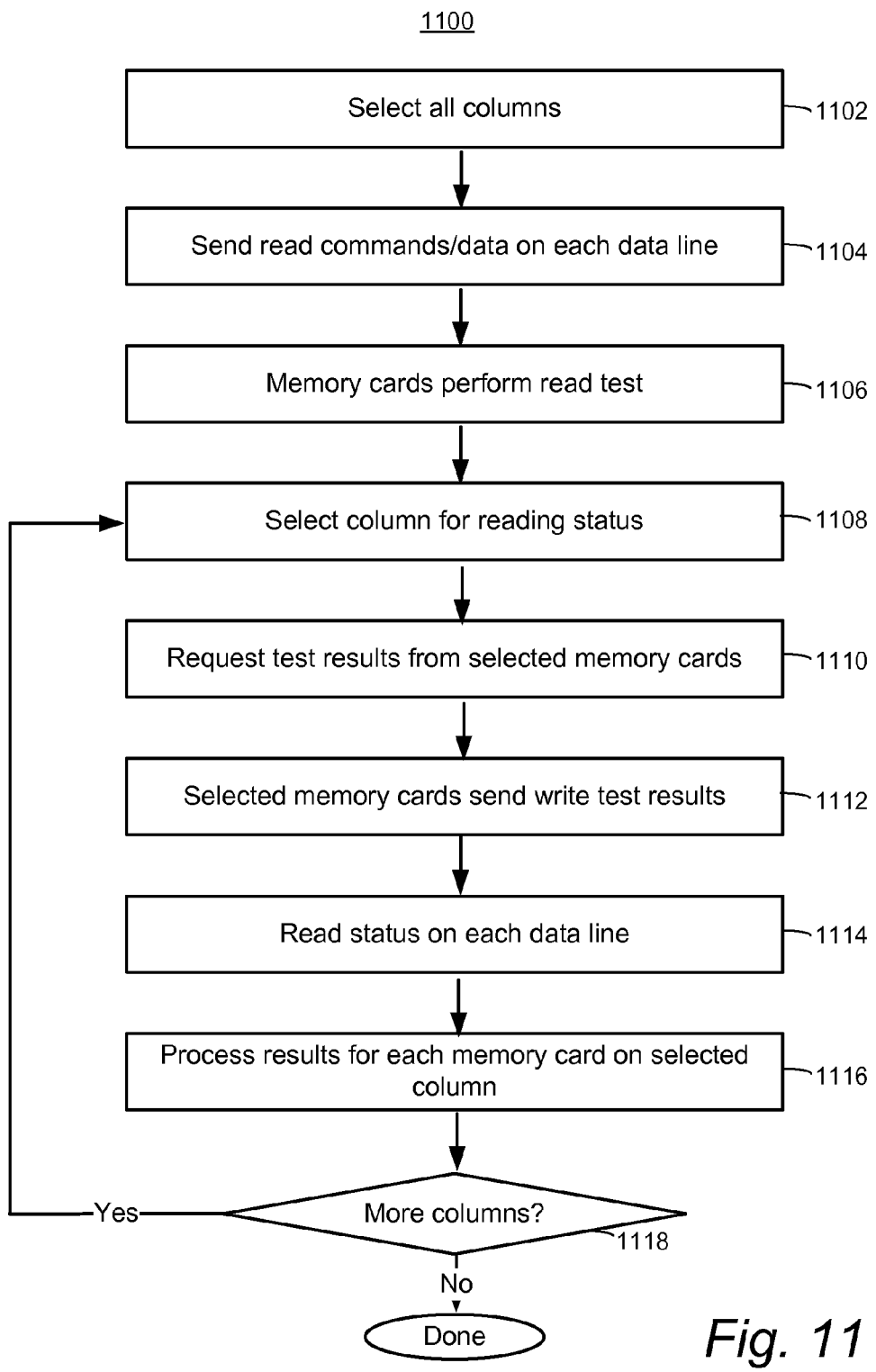
FIG. 11 is a flowchart of one embodiment of a process of testing read of the memory array.
Figure 12:
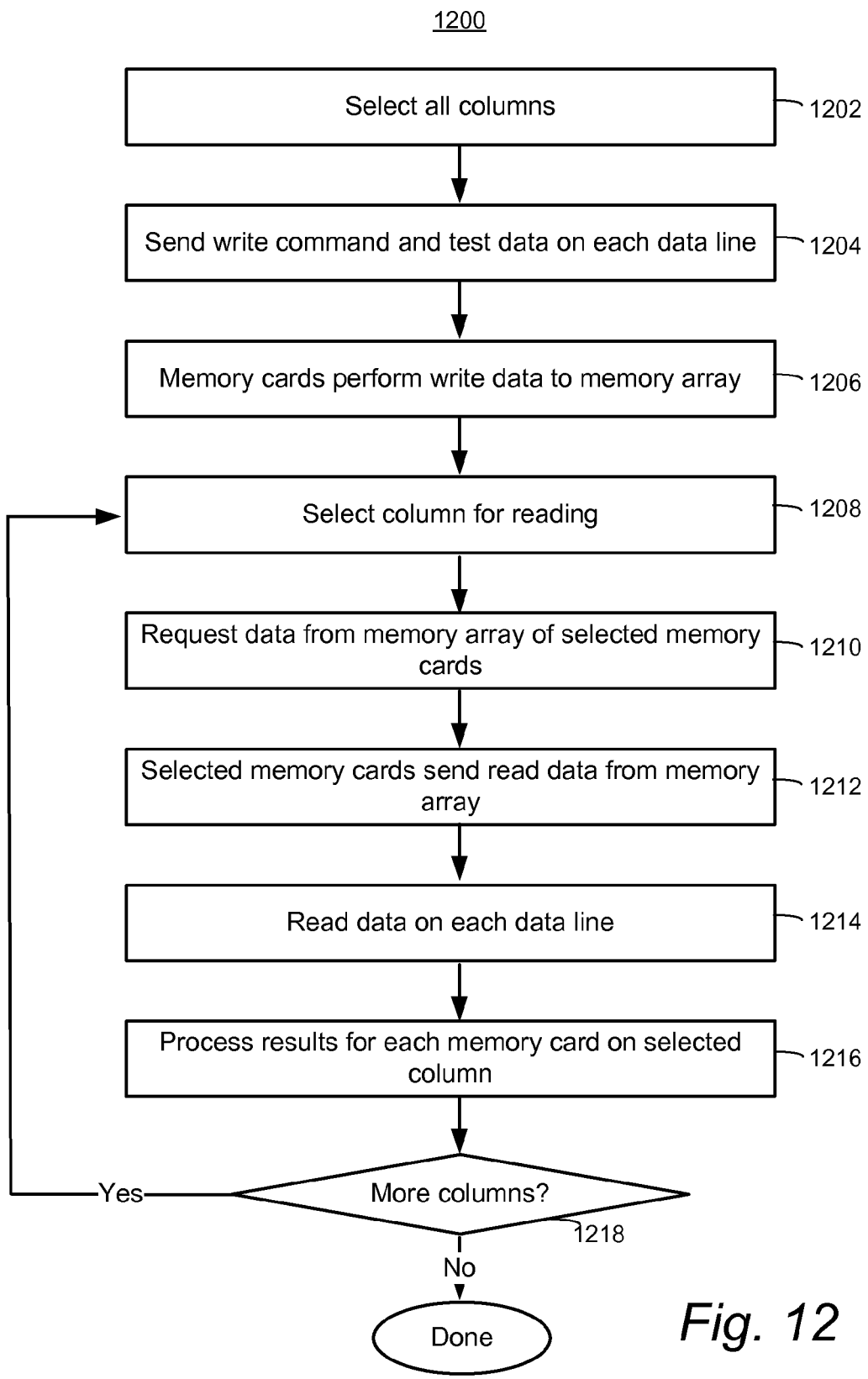
FIG. 12 is a flowchart of one embodiment of a process of testing write and read of the memory array.

FIG. 9 is a flowchart of one embodiment of a process 900 of testing erase of the memory array 200. FIG. 10 is a flowchart of one embodiment of a process 1000 of testing write of the memory array 200. FIG. 11 is a flowchart of one embodiment of a process 1100 of testing read of the memory array 200. FIG. 12 is a flowchart of one embodiment of a process 1200 of testing write and read of the memory array 200.

Process 900 involves an erase self test. For example, each memory card 126 may perform a built-in self test to determine whether the memory array 200 (or selected regions) erases properly. Process 900 may be repeated multiple times, with each memory card 126 testing a different part of the memory array 200 each time the process 900 is performed. In step 902 of process 900, all columns of memory cards 126 are selected. In one embodiment, the test select logic 105 sends appropriate signals to all registers 304 to select all columns of memory cards 126.

In step 904, the test unit 101 sends one or more erase commands and/or data on each serial data I/O line 307. These commands may specify a specific part of the memory array 200 to test. Thus, each memory card 126 will receive the same erase commands and/or data.

In step 906, the test logic 203 in each memory card 126 performs an erase test of some portion of the memory array 200. This might be an erase of some portion of the memory array 200, or even the entire memory array. This erase test may be a built in self test (BIST). Thus, the test logic 203 may determine success/failure or other status of the erase test.

In step 908, the test unit 101 selects one column of memory cards 126 for reading test status. For example, the test select logic 105 might set the first register 304 to "1" and the rest to "0." The test unit 101 then requests test results from each of the selected memory cards (step 910). For example, the test unit 101 sends a suitable command on the serial data I/O line 307. Only the selected memory cards 126 should respond to this request.

In step 912, the selected memory cards 126 send test results on the serial data I/O lines 307. In step 914, the test unit 101 reads each serial data I/O line 307 for test results. In step 916, the test unit 101 processes the test results.

The test unit 101 then determines if there are more columns of memory cards 126 to receive test results from (step 918). If so, the next column is selected by returning to step 908. In this case, the second register 304 may be set to "1" with the rest set to "0". Step 908-918 may be repeated until test results have been received from all memory cards 126. Then, the process 900 concludes. As noted the process may be repeated to test a different portion of memory array 200.

FIG. 10 is a flowchart of one embodiment of a process 1000 of testing write of the memory array 200. As with the erase test, this may be a BIST. In step 1002 of process 1000, all columns of memory cards 126 are selected. In one embodiment, the test select logic 105 sends appropriate signals to each register 304 to select each column of memory cards 126.

In step 1004, the test unit 101 sends write commands and/or data on each serial data I/O line 307. Thus, each memory card 126 will receive the same write commands and/or data.

In step 1006, the test logic 203 in each memory card 126 performs a write test of some portion of the memory array 200. For example, the test logic 203 writes data to specified areas of the memory array 200. The test logic 203 might also read back the data and perform a comparison to determine whether the write was successful.

In step 1008, the test unit 101 selects one column of memory cards 126 for reading status. For example, the test select logic 105 might set the first register 304 to "1" and the rest to "0." The test unit 101 then requests test results from each of the selected memory cards (step 1010). For example, the test unit 101 sends a suitable command on the serial data I/O line 307. Only the selected memory cards 126 should respond to this request.

In step 1012, the selected memory cards 126 send test results on the serial data I/O lines 307. In step 1014, the test unit 101 reads each serial data I/O line 307 for test results. In step 1016, the test unit 101 processes the test results.

The test unit 101 then determines if there are more columns of memory cards 126 to receive test results from (step 1018). If so, the next column is selected by returning to step 1008. In this case, the second register 304 may be set to "1" with the rest set to "0". Step 1008-1018 may be repeated until test results have been received from all memory cards 126. Then, the process 1000 concludes.

FIG. 11 is a flowchart of one embodiment of a process 1100 of testing read of the memory array 200. This may be a BIST. In step 1102 of process 1100, all columns of memory cards 126 are selected. In one embodiment, the test select logic 105 sends appropriate signals to each register 304 to select each column of memory cards 126.

In step 1104, the test unit 101 sends read commands and/or data on each serial data I/O line 307. Thus, each memory card 126 will receive the same read commands and/or data.

In step 1106, the test logic 203 in each memory card 126 performs a read test of some portion of the memory array 200. In this embodiment, the test is a BIST. Therefore, the memory card 126 makes its own determination as to success/failure.

In step 1108, the test unit 101 selects one column of memory cards 126 for reading status. For example, the test select logic 105 might set the first register 304 to "1" and the rest to "0." The test unit 101 then requests test results from each of the selected memory cards (step 1110). For example, the test unit 101 sends a suitable command on the serial data I/O line 307. Only the selected memory cards 126 should respond to this request.

In step 1112, the selected memory cards 126 send test results on the serial data I/O lines 307. In step 1114, the test unit 101 reads each serial data I/O line 307 for test results. In step 1116, the test unit 101 processes the test results.

The test unit 101 then determines if there are more columns of memory cards 126 to receive test results from (step 1118). If so, the next column is selected by returning to step 1108. In this case, the second register 304 may be set to "1" with the rest set to "0". Step 1108-1118 may be repeated until test results have been received from all memory cards 126. Then, the process 1100 concludes.

Note that is it not required that the test be a BIST. FIG. 12 is a flowchart of one embodiment of a process 1200 of testing write and read of the memory array 200 that is not a BIST. In step 1202 of process 1200, all columns of memory cards 126 are selected. In one embodiment, the test select logic 105 sends appropriate signals to each register 304 to select each column of memory cards 126.

In step 1204, the test unit 101 sends a write command and data to be written. Note that the data might be a pattern, as opposed to large blocks of data. The write command and data is sent on each serial data I/O line 307. Thus, each memory card 126 will receive the same data (or pattern) to be written to some portion of its memory array 200.

In step 1206, the test logic 203 in each memory card 126 writes the data to some portion of the memory array 200. In step 1208, the test unit 101 selects one column of memory cards 126 for reading back the data. For example, the test select logic 105 might set the first register 304 to "1" and the rest to "0." The test unit 101 then requests data from each of the selected memory cards (step 1210). For example, the test unit 101 sends a suitable command on the serial data I/O line 307. Only the selected memory cards 126 should respond to this request.

In step 1212, the selected memory cards 126 read appropriate portions of their memory arrays 200 and send this data on the serial data I/O lines 307. In step 1214, the test unit 101 reads each serial data I/O line 307. In step 1216, the test unit 101 processes the received data to determine success/failure of the test.

The test unit 101 then determines if there are more columns of memory cards 126 to receive test results from (step 1218). If so, the next column is selected by returning to step 1208. In this case, the second register 304 may be set to "1" with the rest set to "0". Step 1208-1218 may be repeated until data has been received from all memory cards 126. Then, the process 1200 concludes.

As noted above the host interface 510 may have two or more rows of pins 110. FIG. 13 is a diagram of one embodiment of a memory card 126 in which there are two rows of host interface pins 110. In this example, the test interface 532 has three contacts 132.

FIG. 14 is a diagram of one embodiment of a memory card 126 in which the test interface 532 has a single contact 132c. The other two contacts for testing the memory array 200 are certain pins 110a, 110b in the host interface 510. In this case, the test select contact 132c in the test interface 532 may function similar to contact 132c in the embodiment of FIG. 1. However, rather than the test interface 532 having a contact for transferring data serially during test mode, one of the pins 110b in the host interface 510 may be used. Similarly, one of the pins 110a in the host interface 510 may be used as a clock contact during test mode. Thus, pin 110b may be a "second contact" and pin 110a may be a "third contact," used to test the memory card 126. The memory card 126 may be forced into test mode in a similar manner as embodiments having three contacts 132a-132c in the test interface 510. For example, after power on, contact 132c may be provided with a high signal to establish serial data test data mode.

One embodiment disclosed herein includes a memory card comprising a memory array, a first contact for receiving a test select signal having a select state and an unselect state, a second contact for communicating data serially depending on the state of the select signal, a third contact for receiving a clock signal, and logic coupled to the first contact, the second contact, the third contact, and the memory array. The logic communicates data serially via the second contact in conjunction with the clock signal when the test select signal has the select state. The memory card does not transmit any data via the second contact when the test select signal has the unselect state. The logic is configured to test the memory array based on data received at the second contact.

One embodiment disclosed herein includes a method of testing memory cards. The memory cards include a plurality of groups of memory cards with the method comprising the following. A first contact of each of the memory cards is caused to be configured as a test select. A given memory card is configured to monitor its first contact for a test select signal having a select state and an unselect state when its first contact is configured as a test select. A second contact of respective ones of the memory cards is caused to be configured to communicate data serially while the test select signal at the first contact of the respective memory cards has the select state. The memory cards are configured to not transmit any data on the second contact when the test select signal provided to the first contact has the unselect state. The memory cards are tested using the second contact for transferring test data while independently selecting different groups of the memory cards using the first contact.

One embodiment disclosed herein includes a system for testing a plurality of groups of memory cards. The system includes logic that is configured to provide a select signal having a select state and an unselect state to the memory cards. The select signal is provided with the select state for memory cards in one or more selected groups of the memory cards and with the unselect state for memory cards in any unselected groups of the memory cards. The system includes a data transfer module that is configured to send test data to the selected memory cards on a plurality of serial data lines. Each of the serial data lines provides test data to one memory card in each of the selected groups. The data transfer module receives test data on the plurality of serial data lines from selected memory cards while one group of the memory cards is selected by the logic. Each of the serial data lines receives test data from one memory card in each of the selected groups.

One embodiment disclosed herein includes a method of testing memory cards. The memory cards include a plurality of groups of memory cards, with the method comprising the following. Test data is sent to the memory cards on a plurality of serial data lines. Each of the serial data lines provides test data to one memory card in each of the groups. A select signal is applied to select memory cards in a selected group of the memory cards and unselect memory cards in unselected groups of the memory cards. Test data is received on the plurality of serial data lines while the selected groups remain selected and the unselected memory cards remain unselected. Each of the serial data lines receives test data from one memory card in the selected group.

One embodiment disclosed herein includes forming or fabricating a memory card. The method includes providing a memory array, providing a first contact for receiving a test select signal having a select state and an unselect state, providing a second contact for communicating data serially depending on the state of the select signal, providing a third contact for receiving a clock signal, and providing logic coupled to the first contact, the second contact, the third contact, and the memory array. The logic communicates data serially via the second contact in conjunction with the clock signal when the test select signal has the select state. The memory card does not transmit any data via the second contact when the test select signal has the unselect state. The logic is configured to test the memory array based on data received at the second contact.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A memory card comprising:
    a memory array;
    a first contact that receives a test select signal having a select state and an unselect state;
    a second contact that communicates data serially depending on the state of the test select signal;
    a third contact that receives a clock signal; and
    logic coupled to the first contact, the second contact, the third contact, and the memory array, the logic communicates data serially via the second contact in conjunction with the clock signal when the test select signal has the select state, the memory card does not transmit any data via the second contact when the test select signal has the unselect state, the logic is configured to test the memory array based on data received at the second contact.

2. The memory card of claim 1, wherein the logic responds to external commands to configure the first contact as a test select, the memory card monitors the first contact for the test select signal when the first contact is configured as a test select.

3. The memory card of claim 1, further comprising a host interface, wherein the first contact, the second contact, and the third contact are part of a test interface that is separate from the host interface.

4. The memory card of claim 1, further comprising a semiconductor die having test pads, the first contact, the second contact, and the third contact are electrically connected to the test pads.

5. The memory card of claim 1, further comprising a host interface, wherein one or more of the first contact, the second contact, or the third contact are part of the host interface.

6. The memory card of claim 1, wherein the memory array is a NAND memory array.

7. A system that tests groups of memory cards, the system including:
    logic that causes a first contact of each of the memory cards to be configured as a test select, a given memory card monitors its first contact for a test select signal having a select state and an unselect state when its first contact is configured as a test select;
    the logic causes a second contact of respective ones of the memory cards to be configured to communicate data serially while the test select signal at the first contact of the respective memory cards has the select state, the memory cards are configured to not transmit any data on the second contact when the test select signal at the first contact has the unselect state; and
    a testing unit having a plurality of serial data input/output lines, each of the serial data input/output lines is communicatively coupled to the second contact of one of the memory cards in each of the groups.

8. The system of claim 7, wherein a given memory card includes a semiconductor die having test pads, the first contact and the second contact are electrically connected to the test pads.

9. The system of claim 7, wherein the logic configures the memory cards to ignore any data received at the second contact when the first contact is configured as a test select and the test signal at the first contact has the unselect state.

10. The system of claim 7, wherein the logic transmits data to the second contact to enable a test mode, the memory cards are configured to stay in the test mode regardless of the state of the select signal provided at the first contact.

11. The system of claim 7, further comprising:
logic that provides the test select signal to the memory cards, the test select signal is provided with the select state for memory cards in one or more selected groups of the memory cards and with the unselect state for memory cards in any unselected groups of the memory cards; and
a data transfer module that is configured to send test data to the selected memory cards on the plurality of serial data input/output lines, each of the serial data input/output lines provides test data to one memory card in each of the selected groups, the data transfer module receives test data on the plurality of serial data input/output lines from selected memory cards while one group of the memory cards is selected, each of the serial data input/output lines receives test data from one memory card in each of the selected groups.

12. The system of claim 11, wherein a given memory card includes a semiconductor die having test pads, the test select signal is provided to a first test pad of the test pads, the test data is provided to a second test pad of the test pads, wherein the system provides a dock signal to a third test pad of the test pads.

13. A method of testing groups of memory cards, the method comprising:
causing a first contact of each of the memory cards to be configured as a test select, a given memory card is configured to monitor its first contact for a test select signal having a select state and an unselect state when its first contact is configured as a test select;
causing a second contact of respective ones of the memory cards to be configured to communicate data serially while the test select signal at the first contact of the respective memory cards has the select state, the memory cards are configured to not transmit any data on the second contact when the test select signal provided to the first contact has the unselect state; and
testing the memory cards using the second contact for transferring test data while independently selecting different groups of the memory cards using the first contact.

14. The method of claim 13, wherein a given memory card includes a semiconductor die having test pads, the first contact and the second contact of the given memory card are electrically connected to the test pads.

15. The method of claim 13, wherein the memory cards are configured to ignore any data received at the second contact when the test select signal at the first contact has the unselect state and the first contact is configured as a test select.

16. The method of claim 13, further comprising transmitting data to the second contact of a given memory card to cause the given memory card to enter a test mode, the given memory card stays in the test mode regardless of the state of the select signal at the first contact.

17. The method of claim 13, wherein the testing the memory cards using the second contact while independently selecting different groups of the memory cards using the first contact includes:
providing the test select signal with the select state to the first contact of all of the memory cards;
providing test data to the second contact of all of the memory cards;
providing the test select signal with the select state to a selected group of the memory cards while applying the test select signal with the unselect state to any unselected memory cards;
receiving test results from the second contact of the selected group of the memory cards; and
repeating the providing the test select signal with the select state to a selected group of the memory cards while applying the test select signal with the unselect state to any unselected memory cards and the receiving test results for other groups of the memory cards.

18. The method of claim 13, further comprising:
sending test data to the memory cards on a plurality of serial data lines, each of the serial data lines provides test data to one memory card in each of the groups;
applying the test select signal to selected memory cards in a selected group of the memory cards and unselected memory cards in unselected groups of the memory cards; and
receiving test data on the plurality of serial data lines while the selected group remains selected and the unselected groups of the memory cards remain unselected, each of the serial data lines receives test data from one memory card in the selected group.

19. The method of claim 18, wherein the sending test data to the memory cards on a plurality of serial data lines includes providing the test data to a test interface of the memory cards that is separate from a host interface.

* * * * *